US012581618B2

(12) United States Patent

Wang et al.

(10) Patent No.: US 12,581,618 B2
(45) Date of Patent: Mar. 17, 2026

(54) STACKED COLD PLATE WITH FLOW GUIDING VANES HAVING THROUGH HOLES AND METHOD OF MANUFACTURING

(71) Applicant: Rolls-Royce Corporation, Indianapolis, IN (US)

(72) Inventors: Shuai Wang, Singapore (SG); Chandana J. Gajanayake, Singapore (SG); David R. Trawick, Indianapolis, IN (US)

(73) Assignee: Rolls-Royce Corporation, Indianapolis, IN (US)

( * ) Notice: Subject to any disclaimer, the term of this patent is extended or adjusted under 35 U.S.C. 154(b) by 1030 days.

(21) Appl. No.: 17/702,753

(22) Filed: Mar. 23, 2022

(65) Prior Publication Data

US 2023/0309260 A1     Sep. 28, 2023

(51) Int. Cl.
 *H05K 7/20* (2006.01)
(52) U.S. Cl.
 CPC ................................. *H05K 7/20254* (2013.01)
(58) Field of Classification Search
 CPC ....................... H05K 7/20254; H05K 7/20927
 See application file for complete search history.

(56) References Cited

U.S. PATENT DOCUMENTS

| | | | |
|---|---|---|---|
| 2,640,329 | A | 6/1953 | Ingvardsen |
| 5,353,865 | A | 10/1994 | Adiutori et al. |
| 5,983,997 | A | 11/1999 | Hou |
| 7,000,684 | B2 | 2/2006 | Kenny et al. |
| 7,298,618 | B2 | 11/2007 | Campbell et al. |
| 7,353,859 | B2 | 4/2008 | Stevanovic et al. |
| 8,305,755 | B2 | 11/2012 | Dede |
| 8,427,832 | B2 | 4/2013 | Dede et al. |
| 8,482,919 | B2 | 7/2013 | Dede |
| 8,659,896 | B2 | 2/2014 | Dede et al. |
| 9,131,631 | B2 | 9/2015 | Joshi |
| 9,219,022 | B2 | 12/2015 | Parida |
| 9,230,726 | B1 | 1/2016 | Parker et al. |
| 9,252,069 | B2 | 2/2016 | Bhunia et al. |
| 9,445,526 | B2 | 9/2016 | Zhou et al. |
| 9,622,380 | B1 | 4/2017 | Joshi et al. |

(Continued)

FOREIGN PATENT DOCUMENTS

| | | | | |
|---|---|---|---|---|
| CN | 112002956 A | * | 11/2020 | .......... H01M 10/613 |
| JP | 2018207017 | | 12/2018 | |
| JP | 6482954 | | 3/2019 | |

*Primary Examiner* — Jianying C Atkisson
*Assistant Examiner* — Khaled Ahmed Ali Al Samiri
(74) *Attorney, Agent, or Firm* — Barnes & Thornburg LLP

(57) ABSTRACT

A cold plate assembly for cooling an electronic device includes a manifold, a comb insert, and a plurality of vanes. The manifold is formed to define a cavity therein. The comb insert is located in the cavity and formed to include channels for receiving a fluid from cooling passages in the manifold and transfer heat to the fluid. The plurality of vanes are removably coupled with the comb insert and are located in the channels to guide the fluid through channels. The vanes extend between walls that define the channels. Each vane is formed to define a throughhole formed therein to direct the fluid at the first wall or the second wall with increased velocity so as to increase the heat transfer between the fluid and the first wall or the second wall.

19 Claims, 8 Drawing Sheets

(56)     References Cited

U.S. PATENT DOCUMENTS

| | | | |
|---|---|---|---|
| 9,653,379 | B2 | 5/2017 | Koyama et al. |
| 9,980,415 | B2 | 5/2018 | Zhou et al. |
| 10,306,802 | B1 | 5/2019 | Ditri et al. |
| 10,566,265 | B2 | 2/2020 | Fukuoka et al. |
| 10,645,842 | B2 | 5/2020 | Parida |
| 10,665,530 | B2 | 5/2020 | Chen et al. |
| 10,903,141 | B2 | 1/2021 | Malouin, Jr. |
| 2002/0112847 | A1 | 8/2002 | Nakahama |
| 2012/0097373 | A1 | 4/2012 | Kandlikar |
| 2018/0023899 | A1* | 1/2018 | Carette ................. F28F 9/0278 165/166 |
| 2019/0360759 | A1 | 11/2019 | Collins et al. |

\* cited by examiner

STACKED COLD PLATE WITH FLOW GUIDING VANES HAVING THROUGH HOLES AND METHOD OF MANUFACTURING

FIELD OF THE DISCLOSURE

The present disclosure relates generally to propulsion systems, and more specifically to propulsion systems including electric propulsion components.

BACKGROUND

Gas turbine engines are used to power aircraft, watercraft, power generators, and the like. Additionally, propulsion units that produce thrust for aircraft, watercraft, power generators, and the like via electrically driven fans or propellers are being explored as alternatives for conventional, pure-combustion driven engines.

Gas turbine engines as well as electric engines may include a propulsion system having a multitude of electrical components. Cooling of these electrical components during use of operation of the engine is especially important. As such, cooling systems, in particular cooling plates, may be utilized to actively remove heat from the electrical components.

SUMMARY

The present disclosure may comprise one or more of the following features and combinations thereof.

According to a first aspect of the present disclosure, a cold plate assembly for cooling an electronic device include a manifold, a comb insert, and a plurality of vanes. The manifold is formed to define a cavity therein and a plurality of cooling passages extending through the manifold and open into the cavity, and the comb insert is located in the cavity of the manifold and formed to include a plurality of channels for receiving a fluid from the cooling passages and transfer heat to the fluid, the comb insert including a base panel and a plurality of comb walls protruding away from the base panel and extending from a first end of the base panel to a second end of the base panel opposite the first end to define the plurality of channels.

The plurality of vanes is removably coupled with the comb insert and received in one of the plurality of channels to guide the fluid through the one of the plurality of channels, the plurality of vanes extending between a first wall of the plurality of comb walls and a second wall of the plurality of comb walls neighboring the first wall, each of the plurality of vanes being formed to define a throughhole formed therein to direct the fluid at the first wall or the second wall with increased velocity so as to increase the heat transfer between the fluid and the first wall or the second wall.

In some embodiments, the plurality of vanes includes a plurality of first vanes and a plurality of second vanes, each first vane of the plurality of first vanes extends from the first wall to the second wall of the plurality of comb walls, and each second vane of the plurality of second vanes extends from the second wall to the first wall of the plurality of comb walls.

In some embodiments, each first vane of the plurality of first vanes includes a first base end and a first terminal end opposite the first base end, each second vane of the plurality of second vanes includes a second base end and a second terminal end opposite the second base end, each first vane extends from the first base end contacting the first wall of the plurality of comb walls to the first terminal end contacting the second wall of the plurality of comb walls, and each second vane extends from the second base end contacting the second wall to the second terminal end contacting the first wall.

In some embodiments, the first base end of each first vane contacts the second terminal end of an adjacent second vane, and the second base end of each second vane contacts the first terminal end of an adjacent first vane so as to form a zigzag pattern in the plurality of vanes.

In some embodiments, the first base end of each first vane is connected to the second terminal end of an adjacent second vane, and the second base end of each second vane is connected to the first terminal end of an adjacent first vane so as to form a single strip of vanes.

In some embodiments, each first vane and each second vane also extends from the first and second walls, respectively, toward the second end of the base panel, and the first angle and the second angle are in a range of 45 degrees to 85 degrees.

In some embodiments, the first angle is equal to the second angle.

In some embodiments, the throughhole of each first vane is arranged closer to the first base end than the first terminal end, and the throughhole of each second vane is arranged closer to the second base end than the second terminal end.

In some embodiments, the plurality of cooling passages open into the cavity via a plurality of outlets, and the plurality of channels are each aligned with an outlet of the plurality of outlets in order to receive the fluid.

In some embodiments, the manifold includes a manifold body and a bottom plate, wherein the cavity of the manifold is defined by four side walls of the manifold body and a top surface of the bottom plate, and the bottom plate is removably coupled to an underside of the manifold body and is configured to be removed from the manifold body so as to provide access to the plurality of vanes and the comb insert.

In some embodiments, the comb insert includes a plurality of coupling protrusions extending away from a perimeter of the base panel, and the plurality of coupling protrusions are arranged in corresponding coupling recesses formed in a top surface of the manifold body so as to couple the comb insert to the manifold.

According to a further aspect of the present disclosure, a cold plate assembly for cooling an electronic device includes a manifold formed to define a cavity therein and a comb insert located in the cavity of the manifold and formed to include a plurality of channels for receiving a fluid, the comb insert including a plurality of comb walls defining the plurality of channels.

The assembly further includes a plurality of vanes received in one of the plurality of channels to guide the fluid through the one of the plurality of channels, each of the plurality of vanes being formed to define a throughhole formed therein to direct the fluid at the first wall or the second wall with increased velocity so as to increase the heat transfer between the fluid and the first wall or the second wall.

In some embodiments, the plurality of vanes are removably coupled with the comb insert.

In some embodiments, the plurality of vanes extend between a first wall of the plurality of comb walls and a second wall of the plurality of comb walls neighboring the first wall.

In some embodiments, the plurality of vanes includes a plurality of first vanes and a plurality of second vanes, each first vane of the plurality of first vanes extends from the first wall to the second wall of the plurality of comb walls, and each second vane of the plurality of second vanes extends from the second wall to the first wall of the plurality of comb walls.

In some embodiments, each first vane of the plurality of first vanes includes a first base end and a first terminal end opposite the first base end, each second vane of the plurality of second vanes includes a second base end and a second terminal end opposite the second base end, each first vane extends from the first base end contacting the first wall of the plurality of comb walls to the first terminal end contacting the second wall of the plurality of comb walls, and each second vane extends from the base end contacting the second wall to the terminal end contacting the first wall.

In some embodiments, the first base end of each first vane is connected to the second terminal end of an adjacent second vane, and the second base end of each second vane is connected to the first terminal end of an adjacent first vane so as to form a single strip of vanes.

In some embodiments, the plurality of channels extend from a first end of the comb insert to a second end of the comb insert opposite the first end, each first vane and each second vane also extends from the first and second walls, respectively, toward the second end of the comb insert, and the first angle and the second angle are in a range of 45 degrees to 85 degrees.

In some embodiments, the manifold includes a plurality of cooling passages extending through the manifold and open into the cavity, and the plurality of channels of the comb insert receive the fluid from the plurality of cooling passages and transfer heat to the fluid.

According to a further aspect of the present disclosure, a method includes forming a cavity within a manifold, forming a plurality of cooling passages within the manifold, the plurality of cooling passages opening into the cavity, arranging a comb insert in the cavity of the manifold, the comb insert including a plurality of channels for receiving a fluid from the plurality of cooling passages and transferring heat to the fluid, the comb insert including a base panel and a plurality of comb walls protruding away from the base panel and extending from a first end of the base panel to a second end of the base panel opposite the first end to define the plurality of channels, removably coupling a plurality of vanes with the comb insert, the plurality of vanes being received in one of the plurality of channels to guide the fluid through the one of the plurality of channels, the plurality of vanes extending between a first wall of the plurality of comb walls and a second wall of the plurality of comb walls neighboring the first wall, and directing the fluid at the first wall or the second wall through a throughhole formed in each of the plurality of vanes with increased velocity so as to increase the heat transfer between the fluid and the first wall or the second wall.

These and other features of the present disclosure will become more apparent from the following description of the illustrative embodiments.

DETAILED DESCRIPTION OF THE DRAWINGS

Figure 1:
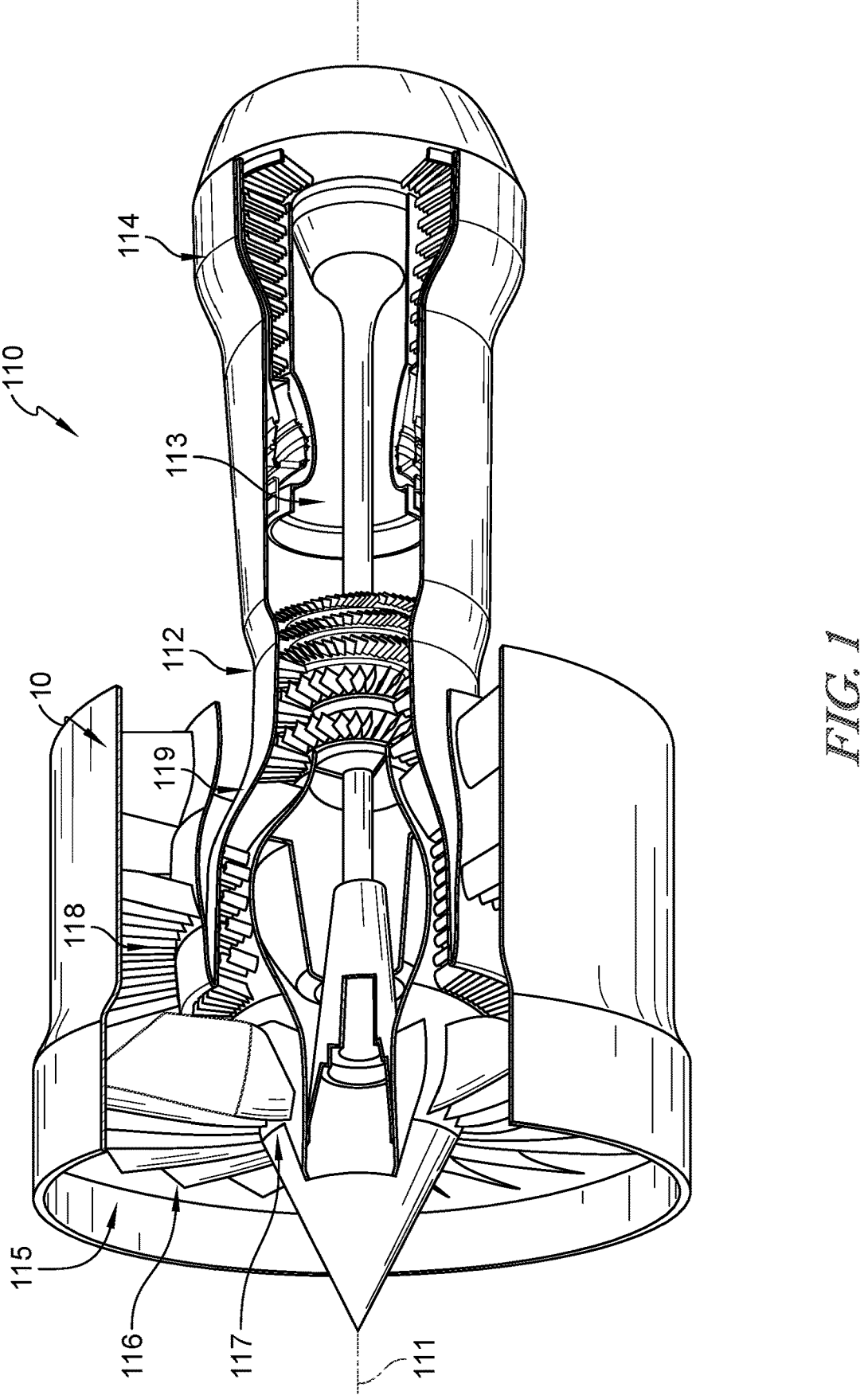
FIG. 1 is a cutaway view of an exemplary gas turbine engine in which a cold plate assembly according to the present disclosure may be arranged, the gas turbine engine including a fan assembly having an inlet fan having plurality of fan blades that extend radially outward relative to the central axis, an engine core having a compressor, a combustor, and a turbine.

For the purposes of promoting an understanding of the principles of the disclosure, reference will now be made to a number of illustrative embodiments illustrated in the drawings and specific language will be used to describe the same.

An illustrative aerospace gas turbine engine 110 includes an engine core having a compressor 112, a combustor 113, and a turbine 114, as shown in FIG. 1. The engine 110 further includes a fan assembly 116 having a plurality of fan blades 117 arranged in an inlet 115 of the engine 110 that is driven by the turbine 114 and provides thrust for propelling an air vehicle by forcing fan exit air through a fan duct 118 that circumferentially surrounds an outer casing 119 of the engine core. The compressor 112 compresses and delivers air to the combustor 113. The combustor 113 mixes fuel with the compressed air received from the compressor 112 and ignites the fuel. The hot, high-pressure products of the combustion reaction in the combustor 113 are directed into the turbine 114 to cause the turbine 114 to rotate about a central axis 111 and drive the compressor 112 and the fan 116. In some embodiments, the fan may be replaced with a propeller, drive shaft, or other suitable configuration.

A cooling system, in particular a cold plate assembly 10, is arranged within the engine 110 and configured to actively remove heat from at least one electrical component within the engine 110. The cold plate assembly 10 of the illustrative embodiment includes a manifold 20, a comb insert 30, and a heat source 80. The cold plate assembly 10, in particular the comb insert 30 and its related components, is arranged in close proximity to the electrical component, which may be the heat source 80 shown in FIG. 2A, in order to receive heat from the electrical component, thus drawing heat away from the component.

In order to remove heat from the electrical component, the comb insert 30 receives heat from the electrical component, and in turn, transfers the heat to a cooling fluid 49 that is flowing through channels 38 formed in the comb insert 30. The cooling fluid 49 receives the heat transferred to it from the walls 40 of the channels 38 of the comb insert 30, and removes the heat from the comb insert 30 via cooling passages 62 formed in the manifold 20. In the illustrative embodiment, the channels 38 include a plurality of vanes 42, which may be formed as singular strips of vanes in some embodiments, arranged therein. The vane strips 42 have vanes 44, 54 that each have throughholes 51, 55 formed therein that direct the fluid 49 toward the walls 40 of the channels 38 at high angles such that the fluid 49 impinges upon the walls 40 with increased velocity so as to increase the heat transfer between the walls 40 and the fluid 49. In some embodiments, the cooling fluid 49 may be a water-glycol mixture.

Figure 2A:
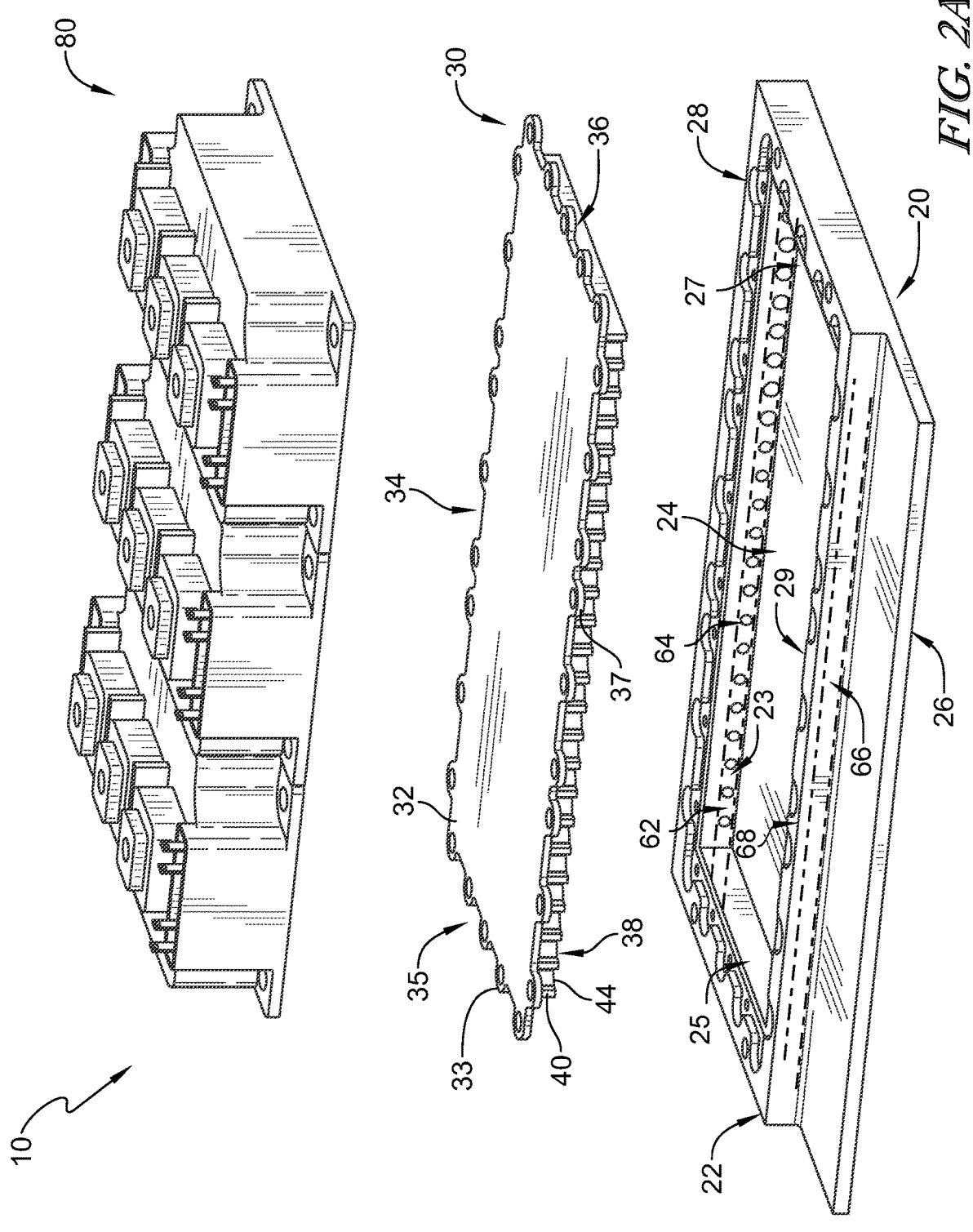
FIG. 2A is a perspective view of a cold plate assembly according to the present disclosure showing a manifold, a comb insert including a plurality of channels defined by a plurality of walls and a plurality of strips of channel vanes arranged within the channels and heat ejection sources arranged on top of the manifold and enclosing the comb insert within.

In the illustrative embodiment, the manifold 20 includes a manifold body 22 and a bottom plate 26 as shown in FIG. 2A. The manifold body 22 may be formed as a rectangular shape having four sides, but other shapes may be utilized based on the cooling and design requirements of the assembly. The manifold body 22 includes four side portions that include inwardly facing surfaces 23, 25, 27, 29. The inwardly facing surface 23, 25, 27, 29 along with an upper surface of the bottom plate 26 define a cavity 24 therein. The manifold 20 further includes a plurality of coupling recesses 28 formed around a top surface of the manifold body 22 that are utilized to couple the comb insert 30 to the manifold 20. The manifold 20 may be comprised of lightweight materials such as low-weight metals.

The manifold 20 further includes cooling passages 62, 66 that extend through two of the side portions of the manifold body 22 as shown in FIG. 2A. The cooling passages 62, 66 open into the cavity 24 via a plurality of outlets 64, 68 that may be formed as small pipes extending out of the cooling passages 62, 66. The plurality of channels 38 formed in the comb insert 30 are each aligned with a pair of opposing outlets 64, 68 in order to receive the fluid 49. Specifically, the fluid 49 may be configured to flow through a first cooling passage 62 and out of the plurality of first outlets 64, through the channels 38 in the comb insert 30, and outwardly through the plurality of second outlets 68 and subsequently through the second cooling passage 64.

Figure 4:
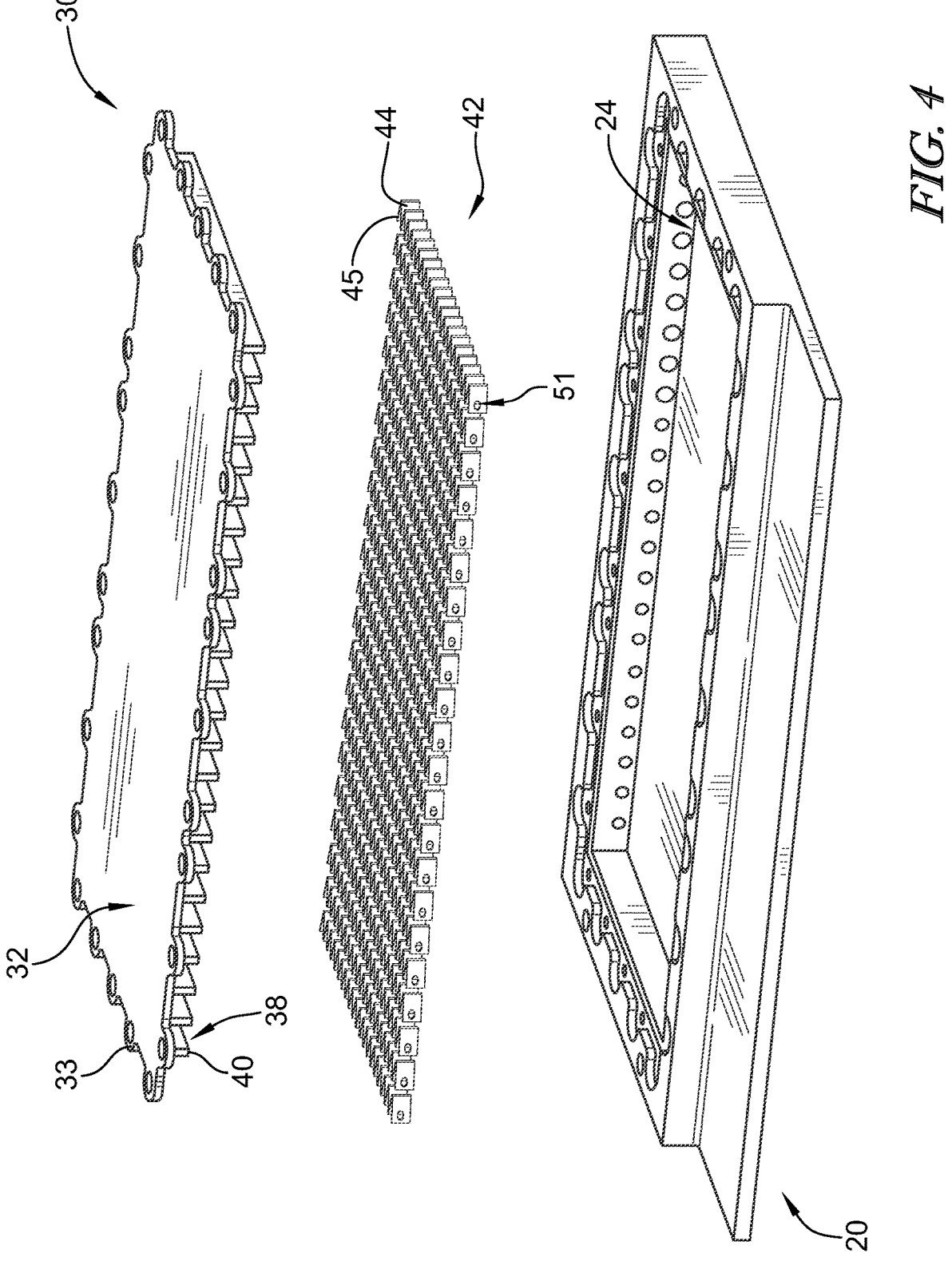
FIG. 4 is a perspective view of the comb insert, manifold, and vane strips of FIG. 3, showing that the manifold includes multiple cooling passages through which the fluid flows, and showing that the fluid flows from the cooling passages, into the channels and around the vane strips of the comb insert, and exits into a cooling channel on the opposing side of the manifold.

In the illustrative embodiment, the comb insert 30 is located in the cavity 24 of the manifold 20, as shown in FIGS. 2A and 4. The comb insert includes a base panel 32 that is formed as a rectangular shape similarly to the manifold body 22 but sized to fit almost entirely within the cavity 24. The base panel 32 is generally planar and includes four sides 34, 35, 36, 37, each side including a plurality of coupling protrusions 33 formed as partial discs that extend away from the four sides 34, 35, 36, 37 of the base panel 32. The coupling protrusions 33 are arranged in corresponding coupling recesses 28 formed in the top surface of the manifold body 22 so as to couple the comb insert 30 to the manifold 20. The coupling protrusions 33 may include throughholes therein for fasteners to be inserted for coupling to the manifold 20.

Figure 2B:
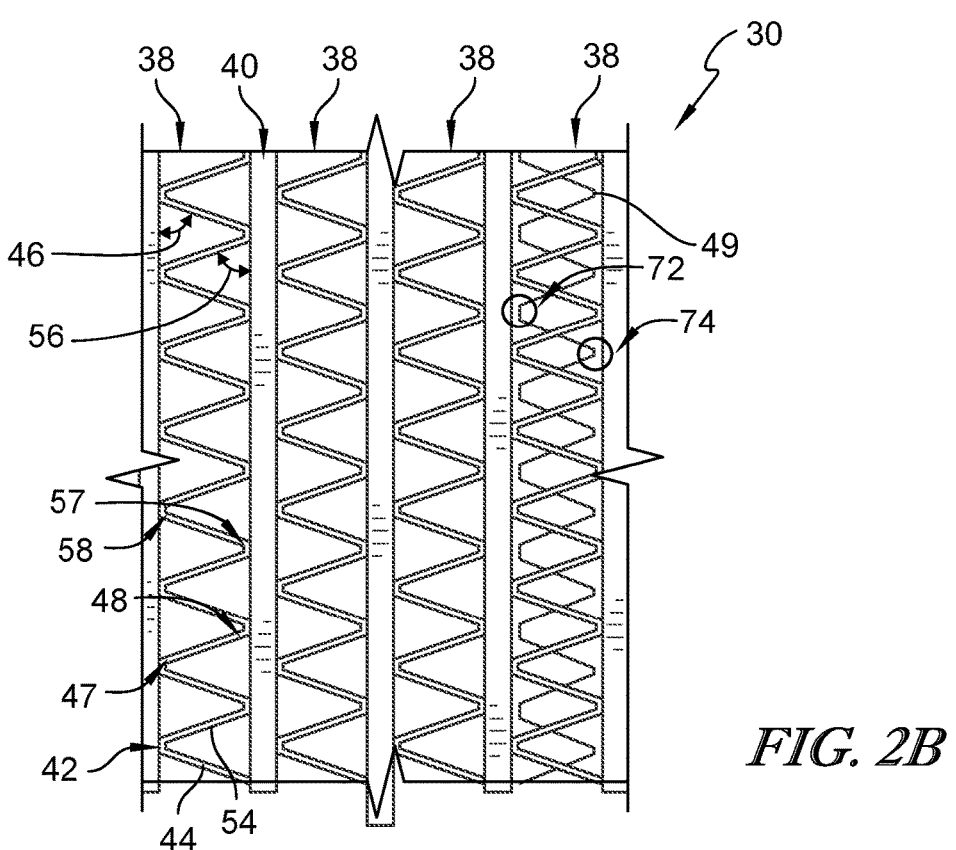
FIG. 2B is a top view of a section of the comb insert and the plurality of strips of channel vanes of FIG. 2A, showing that each vane strip includes a plurality of first channel vanes extending away from a first wall of the channel toward a second wall of the channel and a plurality of second channel vanes extending away from the second wall of the channel toward the first wall of the channel, and showing that each vane includes a throughhole through which the fluid flows such that the fluid is directed to impinge upon the walls with increased velocity so as to increase the heat transfer between the walls and the fluid.
Figure 3:
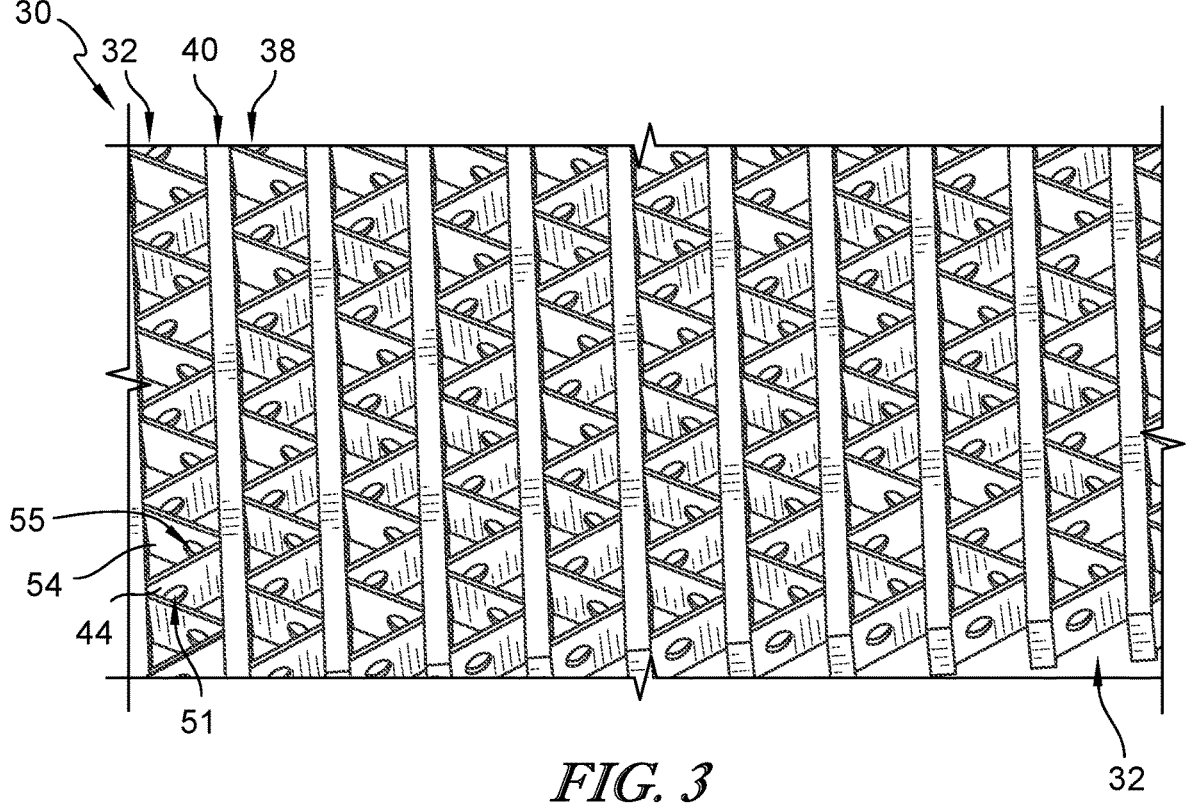
FIG. 3 is a perspective view of a section of the comb insert of the cold plate assembly of FIG. 2A, showing that vane strips are arranged in a zigzag pattern, and showing that the throughholes are formed closer to one side of the vanes.

The comb insert 30 includes a plurality of channels 38 for receiving the fluid 49 from the plurality of cooling passages 62, 66 and transferring heat to the fluid 49, as shown in greater detail in FIGS. 2B and 3. The comb walls 40 protrude away from the base panel 32 and extend across the base panel 32 from the first side 34 to the second side 37 of the base panel 32. In the illustrative embodiment, the walls 40 are perpendicular to the base panel 32. The walls 40 define the channels 38 therein. In the illustrative embodiment, the walls 40 are formed to all be parallel with each other, although the walls 40 may be formed nonparallel with each other based on design requirements of the assembly. The comb insert 30 may include 23 channels, as shown in FIG. 2A, although other numbers of channels may be utilized.

The comb insert 30 may be formed of a material or materials having high thermal conductivity in order to effectively transfer heat from the electrical component to the walls 40 of the comb insert 30, and thus the fluid 49 flowing through the channels 38. In the illustrative embodiment, the comb insert 30 is formed via an extrusion process, although other manufacturing processes may be utilized.

In the illustrative embodiment, the cold plate assembly 10 further includes the plurality of vanes 42 within the channels 38 as shown in FIGS. 2B, 3, and 4. The vanes 42 are arranged in each channel 38 and are removably coupled with the comb insert 30 to guide the fluid 49 through channels 38. In at least one embodiment, the vanes 42, in particular first and second vanes 44, 54 of the plurality of vanes 42, are all attached to each other at their respective base ends 47, 57 and terminal ends 48, 58 so as to form a singular strip of vanes 42. One of ordinary skill in the art would understand that the first and second vanes 44, 54 do not need to be coupled to each other to produce the results described herein (shown as not coupled to each other in FIGS. 3 and 4). The plurality of vanes 42 may include 23 rows of vanes 42, or 23 strips of vanes 42, each arranged in a respective one of the 23 channels 38, as shown in FIG. 4. More or fewer channels and vane rows may be utilized based on the design requirements of the assembly.

However, forming the vanes as a single strip, such as a single metal or plastic strip, further simplifies the manufacturing process. In particular, the vane strips 42 may be formed as a single sheet of multiple vane strips 42 before being folded. The sheet may include multiple rectangular, pre-folded vane strips 42. Then, each vane strip 42 is laser cut from the sheet, perforated, folded, and then installed in the channels 38. This proves to be a simpler process than installing individual vanes 44, 54 within the channels 38.

The plurality of vanes 42 extend between wall 40 of the comb walls 40 as shown in FIG. 2B. In particular, first vanes 44 of the plurality of vanes 42 extend from a first wall 40 to a second, neighboring wall 40. Second vanes 54, each of which is arranged adjacent to a first vane 44, extend from the second wall 40 back to the first wall 40. Each first vane 44 and each second vane 54 extends toward the opposing wall 40 and toward the same end of the channel 38 so as to form a zigzag pattern. "Zigzag" is defined herein as one of a series of short sharp turns, angles, or alterations in a course.

Each first vane 44 includes a base end 47 and a terminal end 48 opposite the base end 47. Similarly, each second vane 54 includes a base end 57 and a terminal end 58 opposite the base end 57. Each first vane 44 extends from the first base end 47, which is contacting the first wall 40, to the first terminal end 48, which is contacting the second, neighboring wall 40. Similarly, each second vane 54 extends from the base end 57, which is contacting the second wall 40, to the terminal end 58, which is contacting the first wall 40. The vanes 44, 54 repeat this pattern through the extent of the channel.

In at least some embodiments, as shown in FIG. 4, the base end 47 of each first vane 44 contacts the terminal end 58 of an adjacent second vane 54, and the base end 57 of each second vane 54 contacts the terminal end 48 of an adjacent first vane 44 so as to form the zigzag pattern in the plurality of vanes 42. In other embodiments in which the vanes 44, 54 are formed as a singular strip of vanes 42, the base end 47 of each first vane 44 is connected to the terminal end 58 of an adjacent second vane 54, and the base end 57 of each second vane 54 is connected to the terminal end 48 of an adjacent first vane 44 so as to form the single strip of vanes 42.

Because the vanes 44, 54 each extend entirely between the walls 40, each of the vanes 44, 54 is formed to define a throughhole 51, 55 therein to direct the fluid at the first wall 40 or the second wall 40 with increased velocity so as to increase the heat transfer between the fluid 49 and the first wall 40 or the second wall 40. As can be seen in FIG. 3, the throughhole 51 of each first vane 44 is arranged closer to the base end 47 than the terminal end 48. Similarly, the throughhole 55 of each second vane 54 is arranged closer to the base end 57 than the terminal end 58. This arrangement of the throughholes 51, 55, in particular the symmetry of having each throughhole 51, 55 closer to the respective base end 47, 57 of the vane 44, 54, facilitates smoother fluid flow.

In the illustrative embodiment, each vane 44 extends away from the first wall 40 at a first angle 46, and each second vane 54 extends away from the second wall 40 as a second angle 56, as shown in greater detail in FIG. 2B. The vanes 44, 54 are angled so as to also extend toward the second side 37 of the comb insert 30, as also shown in FIG. 2B. in the illustrative embodiment, each first vane 44 extends away from the first wall 40 at the same angle 46, and each second vane 54 extends away from the second wall 40 at the same angle 56. In other embodiments, different vanes of the first vanes 44 may extend at differing angles 46, and similarly different vanes of the second vanes 54 may extend at differing angles 56, so long as the fluid 49 is generally directed through the throughholes 51, 55 and at the neighboring wall 40 at a high angle.

In some embodiments, the first angle 46 and the second angle 56 may be in a range of 45 degrees to 85 degrees. In the illustrative embodiment, all first vanes 44 extend away from the first wall 40 at a first angle 46 of approximately 70 degrees, and all second vanes 54 extend away from the second wall 40 at a second angle 56 of approximately 70 degrees. Varying angles may be utilized to affect different heat transfer and cooling rates in specific areas of the comb insert 30.

Due to the arrangement of the vanes 44, 54 and through-holes 51, 55, the fluid 49 flows in a zigzag pattern through the channel 38 and impinges on the walls 40 after having flowed through the throughholes 51, 55 in the impingement areas 72, 74 shown in FIG. 2B. Since the impingement areas 72, 74 have highly effective convective heat transfer, the vanes 44, 54 themselves may not be required to participate in the heat transfer but only serve for flow-guiding purposes. As such, the vanes 44, 54 are not required to be manufactured to be optimized for heat transfer from coolant flow-over. In other words, there does not have to be effective thermal conductance between the vanes 44, 54 and the comb insert 30.

Figure 5:
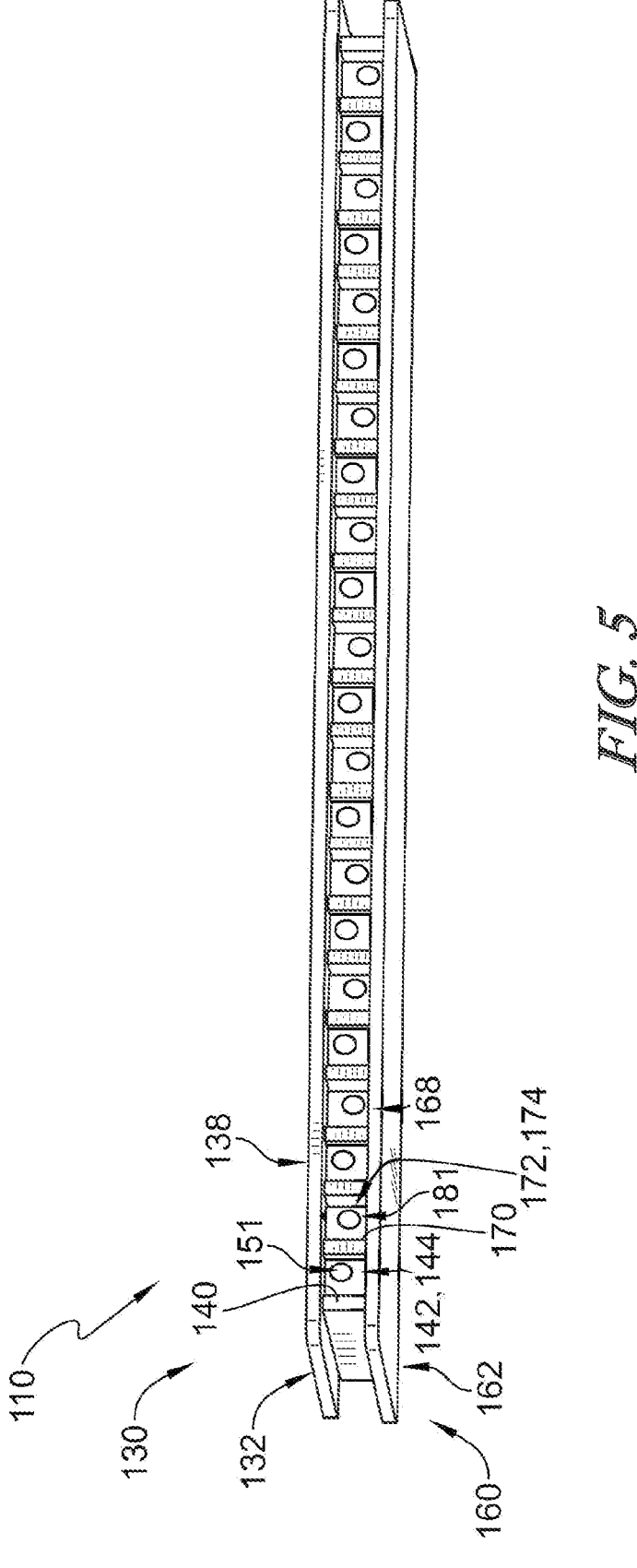
FIG. 5 is a perspective view of a cold plate assembly according to an additional aspect of the present disclosure, showing that the cold plate assembly includes a first comb insert and a second comb insert, and further includes first vane strips in the channels of the first comb insert, and second vane strips in the channels of the second comb insert, and showing that the channels of the first and second comb inserts face each other.

Another embodiment of a cold plate assembly 110 in accordance with the present disclosure is shown in FIG. 5. The cold plate assembly 110 is substantially similar to the cold plate assembly 10 described herein. Accordingly, similar reference numbers in the 100 series indicate features that are common between the cold plate assembly 110 and the cold plate assembly 10. The description of the cold plate assembly 10 is incorporated by reference to apply to the cold plate assembly 110, except in instances when it conflicts with the specific description and the drawings of the cold plate assembly 110.

Two comb inserts 130, 160 that may be utilized in the cold plate assembly 110 is shown in FIG. 5. The comb inserts 130, 160 each include a base panel 132, 162 and walls 140, 170. The base panels 132, 162 and walls 140, 170 are formed substantially similarly to the walls 40 described above. The lower comb insert 160 is arranged relative to the upper comb insert 130 such that the tops of the walls 170 extend upwardly and in between two walls 140 and contact or nearly contact the surface of the base panel 132. Similarly, the tops of the walls 140 extend downwardly and in between two walls 170 and contact or nearly contact the surface of the base panel 162. As such, the interdigitated walls 140, 170 form the channels 138, 168 between them, as can be seen in FIG. 5.

The cold plate assembly 110 includes a first plurality of vanes 142, in particular a plurality of vane strips 142, arranged within the channels 138 formed between a wall 140 on the left and a wall 170 on the right as seen in FIG. 5. Similarly, a second plurality of vanes 172, in particular a plurality of vane strips 172, are arranged within the channels 168 between a wall 170 on the left and a wall 140 on the right as seen in FIG. 5. The first and second vane strips 142, 172 are formed and arranged substantially similarly to the vane strips 42 described above, in particular to have vanes 144, 154 (unable to be seen in FIG. 5), 174, 184 (unable to be seen in FIG. 5) each including throughholes 151, 181 (throughholes in the second vanes 54, 184 are unable to be seen) formed therein. As can be seen in FIG. 5, the comb inserts 130, 160 face each other such that the tops of the channels 138, 168 open toward each other. The additional comb insert 160 provides additional options for configuring the vanes 144, 154, 174, 184 at the same angles to provide uniform cooling rates or differing angles to provide for a variety of cooling rates in different areas of the comb inserts 130, 160.

Figure 6:
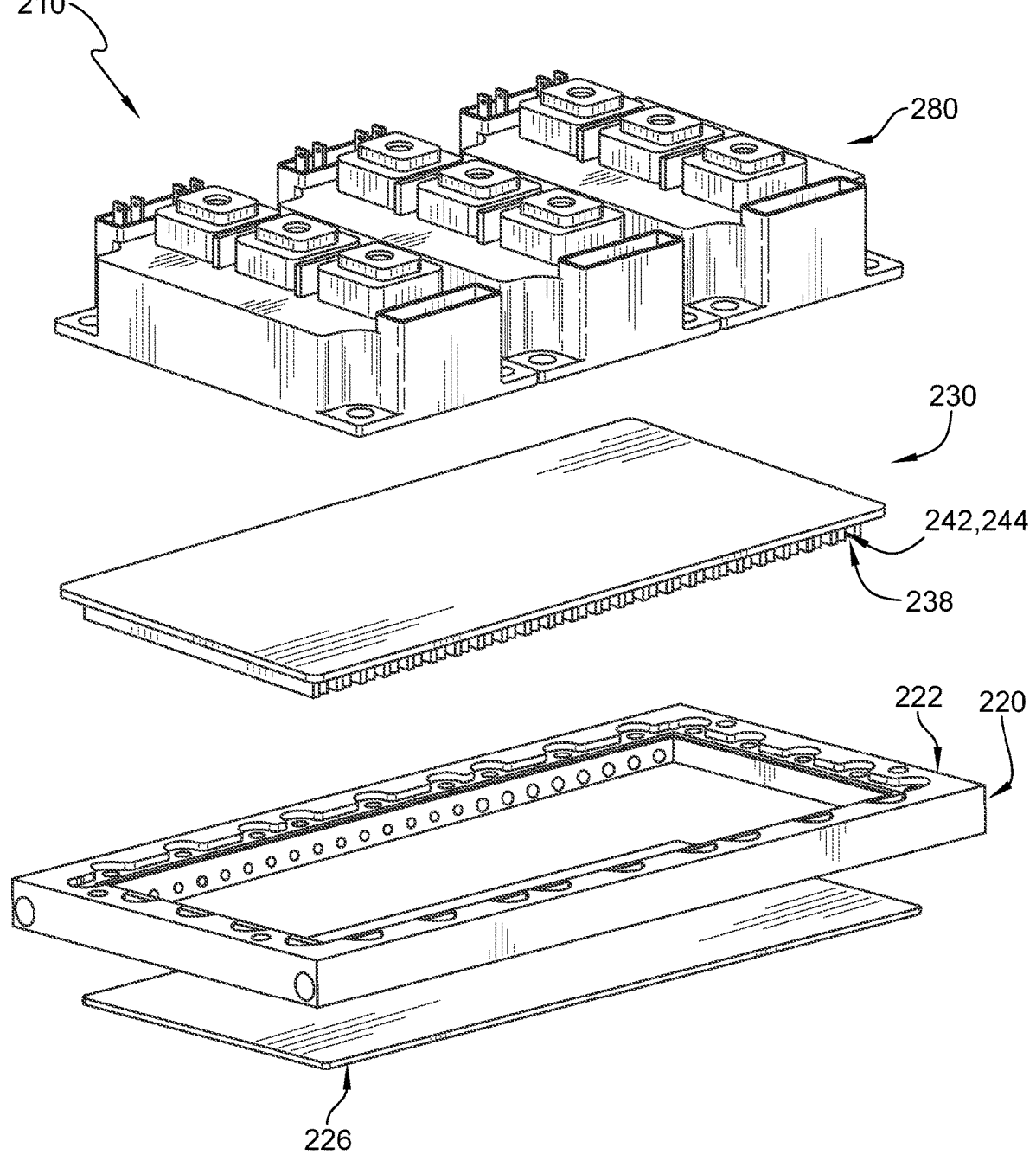
FIG. 6 is a perspective view of a cold plate assembly according to an additional aspect of the present disclosure showing a manifold, a comb insert including a plurality of channels defined by a plurality of walls and a plurality of vane strips arranged within the channels, and heat ejection sources arranged on top of the manifold and enclosing the comb insert within, and showing that a bottom plate of the manifold is removable so as to provide access to the vaned plates and the comb insert.

Another embodiment of a cold plate assembly 210 in accordance with the present disclosure is shown in FIG. 6. The cold plate assembly 210 is substantially similar to the cold plate assemblies 10, 110 described herein. Accordingly, similar reference numbers in the 200 series indicate features that are common between the cold plate assembly 210 and the cold plate assemblies 10, 110. The descriptions of the cold plate assemblies 10, 110 are incorporated by reference to apply to the cold plate assembly 210, except in instances when it conflicts with the specific description and the drawings of the cold plate assembly 210.

The cold plate assembly 210 is formed substantially similarly to the cold plate assembly 10 described above, including a manifold 220 having a manifold body 222, a comb insert 230, and vane strips 242 each having vanes 244 as shown in FIG. 6. Unlike the cold plate assembly 10, the manifold 220 includes a removable bottom plate 226 that is removably coupled to an underside of the manifold body 222. Such a removable bottom plate 226 may improve ease of maintenance in cases of blocked channels. The bottom plate 226 will be exposed to the exterior of the electrical component, which may be a power converter. In case of a blockage occurring in the channels or the event that the vanes are damaged, the cold plate components, including the comb insert 230 and the vane strips 242 can be serviced without opening the power converter or electric component. It will be appreciated that the removable bottom plate 226 may be utilized as the bottom plate 26 of the cold plate assembly 10, a bottom plate 126 utilized in the cold plate assembly 110, and the bottom plates of any other embodiment described herein.

Figure 7A:
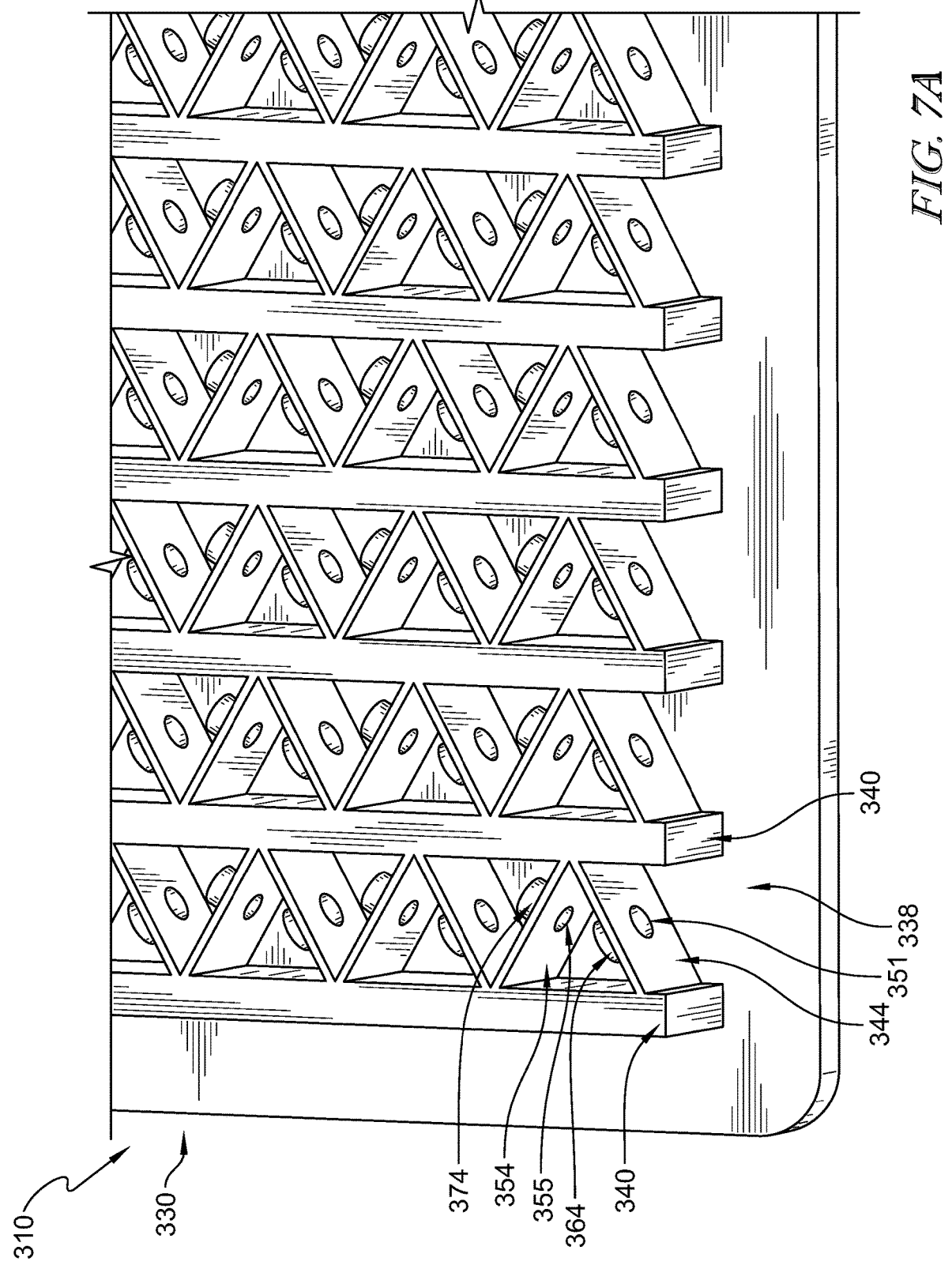
FIG. 7A is a perspective view of a section of a cold plate assembly according to an additional aspect of the present disclosure showing a section of a comb insert and a plurality of strips of channel vanes, showing that each vane strip includes a plurality of first channel vanes extending away from a first wall of the channel toward a second wall of the channel and a plurality of second channel vanes extending away from the second wall of the channel toward the first wall of the channel, showing that each vane includes a throughhole through which the fluid flows such that the fluid is directed to impinge upon the walls with increased velocity so as to increase the heat transfer between the walls and the fluid, and showing that each throughhole includes an extruded boss nozzle extending away from the vane.
Figure 7B:
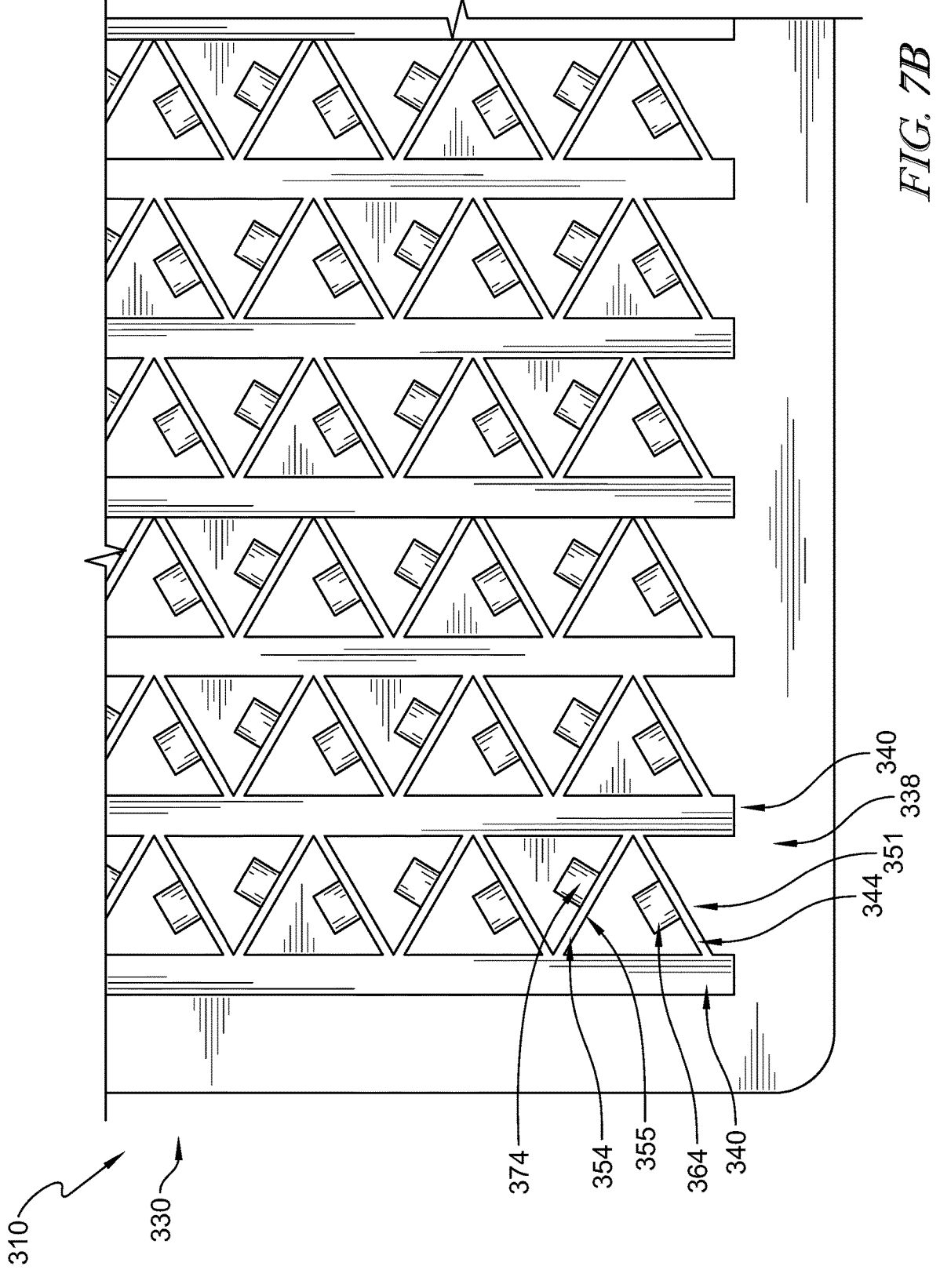
FIG. 7B is a top view of a section of the comb insert and the plurality of strips of channel vanes of FIG. 7A, showing the extruded boss nozzles of each vane.

Another embodiment of a cold plate assembly 310 in accordance with the present disclosure is shown in FIGS. 7A and 7B. The cold plate assembly 310 is substantially similar to the cold plate assemblies 10, 110, 210 described herein. Accordingly, similar reference numbers in the 300 series indicate features that are common between the cold plate assembly 310 and the cold plate assemblies 10, 110, 210. The descriptions of the cold plate assemblies 10, 110, 210 are incorporated by reference to apply to the cold plate assembly 310, except in instances when it conflicts with the specific description and the drawings of the cold plate assembly 310.

The cold plate assembly 310, in particular the comb insert 330, is formed substantially similarly to the cold plate assembly 10 and comb insert 30 described above. The comb insert 330 includes walls 340 with channels 338 formed therebetween. Within the channels 338 are vane strips 342 each having first vanes 344 extending from a first wall 340 to an adjacent second wall 340 and second vanes 354 extending from the adjacent second wall 340 back to the first wall 340 as shown in FIGS. 7A and 7B. The vanes 344, 354 form a zigzag pattern within the channels 338. Each vane 344, 354 also includes throughholes 351, 355 formed therethrough.

Unlike the comb insert 30, each throughhole 351, 355 also includes an extruded boss nozzle 364, 374 extending away from the respective vane 344, 354, as shown in FIGS. 7A and 7B. Each extruded boss nozzle 364, 374 has a diameter that is approximately or exactly equal to the diameter of the respective throughhole 351, 355. Each extruded boss nozzle 364, 374 extends away from the respective vane 344, 354 in the same direction. Due to the focusing of the fluid flow through the extruded boss nozzles 364, 374, the fluid is directed at the respective wall 340 at a high angle at high-speed, thus increasing the heat transfer between the fluid and that wall 340. In some embodiments, the extruded boss nozzles 364, 374 can be formed via burring on a panel of vane strips prior to the folding of the vane strips into the zigzag form.

A method includes forming a cavity within a manifold, forming a plurality of cooling passages within the manifold, the plurality of cooling passages opening into the cavity, and arranging a comb insert in the cavity of the manifold, the comb insert including a plurality of channels for receiving a fluid from the plurality of cooling passages and transferring heat to the fluid, the comb insert including a base panel and a plurality of comb walls protruding away from the base panel and extending from a first end of the base panel to a second end of the base panel opposite the first end to define the plurality of channels.

The method further includes removably coupling a plurality of vanes with the comb insert, the plurality of vanes being received in one of the plurality of channels to guide the fluid through the one of the plurality of channels, the plurality of vanes extending between a first wall of the plurality of comb walls and a second wall of the plurality of comb walls neighboring the first wall, and directing the fluid at the first wall or the second wall through a throughhole formed in each of the plurality of vanes with increased velocity so as to increase the heat transfer between the fluid and the first wall or the second wall.

The impingement flow created by the vanes 44, 54, 144, 154, 174, 184, 244, 254, 354 within the channels 38, 138, 168, 238, 338 produces significantly higher convective heat transfer cooling performance than conventional cooling plate assemblies. Due to the higher cooling effectiveness, the impingement cooling requires much less contact area that the conventional methods. As such, the cold plate assemblies described herein produce compact cold plate designs with reduced weight and size compared to conventional cooling approaches.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:

1. A cold plate assembly for cooling an electronic device, the cold plate comprising a manifold formed to define a cavity therein and a plurality of cooling passages extending through the manifold and open into the cavity, a comb insert located in the cavity of the manifold and formed to include a plurality of channels for receiving a fluid from the cooling passages and transfer heat to the fluid, the comb insert including a base panel and a plurality of comb walls protruding away from the base panel and extending from a first end of the base panel to a second end of the base panel opposite the first end to define the plurality of channels; and a plurality of vanes removably coupled with the comb insert and received in one of the plurality of channels to guide the fluid through the one of the plurality of channels, the plurality of vanes extending between a first wall of the plurality of comb walls and a second wall of the plurality of comb walls neighboring the first wall, each of the plurality of vanes being formed to define a throughhole formed therein to direct the fluid at the first wall or the second wall with increased velocity so as to increase the heat transfer between the fluid and the first wall or the second wall, wherein the plurality of vanes each includes a nozzle extending away from each throughhole in a direction in which the throughhole directs the fluid at the first wall or the second wall.

2. The cold plate assembly of claim 1, wherein the plurality of vanes includes a plurality of first vanes and a plurality of second vanes, wherein each first vane of the plurality of first vanes extends from the first wall to the second wall of the plurality of comb walls, and wherein each second vane of the plurality of second vanes extends from the second wall to the first wall of the plurality of comb walls.

3. The cold plate assembly of claim 2, wherein each first vane of the plurality of first vanes includes a first base end and a first terminal end opposite the first base end, wherein each second vane of the plurality of second vanes includes a second base end and a second terminal end opposite the second base end, wherein each first vane extends from the first base end contacting the first wall of the plurality of comb walls to the first terminal end contacting the second wall of the plurality of comb walls, and wherein each second vane extends from the base end contacting the second wall to the terminal end contacting the first wall.

4. The cold plate assembly of claim 3, wherein the first base end of each first vane contacts the second terminal end of an adjacent second vane, and wherein the second base end of each second vane contacts the first terminal end of an adjacent first vane so as to form a zigzag pattern in the plurality of vanes.

5. The cold plate assembly of claim 4, wherein the first base end of each first vane is connected to the second terminal end of an adjacent second vane, and wherein the second base end of each second vane is connected to the first terminal end of an adjacent first vane so as to form a single strip of vanes.

6. The cold plate assembly of claim 4, wherein each first vane and each second vane also extends from the first and second walls, respectively, toward the second end of the base panel, and wherein a first angle and a second angle formed between the first and second walls and the first and second vanes, respectively, are in a range of 45 degrees to 85 degrees.

7. The cold plate assembly of claim 6, wherein the first angle is equal to the second angle.

8. The cold plate assembly of claim 4, wherein the throughhole of each first vane is arranged closer to the first base end than the first terminal end, and wherein each second vane is arranged closer to the second base end than the second terminal end.

9. The cold plate assembly of claim 4, wherein the plurality of cooling passages open into the cavity via a plurality of outlets, and wherein the plurality of channels are each aligned with an outlet of the plurality of outlets in order to receive the fluid.

10. The cold plate assembly of claim 4, wherein the manifold includes a manifold body and a bottom plate, wherein the cavity of the manifold is defined by four side walls of the manifold body and a top surface of the bottom plate, and wherein the bottom plate is removably coupled to an underside of the manifold body and is configured to be removed from the manifold body so as to provide access to the plurality of vanes and the comb insert.

11. The cold plate assembly of claim 10, wherein the comb insert includes a plurality of coupling protrusions extending away from a perimeter of the base panel, and wherein the plurality of coupling protrusions are arranged in corresponding coupling recesses formed in a top surface of the manifold body so as to couple the comb insert to the manifold.

12. The cold plate assembly of claim 1, wherein the plurality of vanes are removable from the base panel and the plurality of comb walls of the comb insert.

13. A cold plate assembly for cooling an electronic device, the cold plate comprising a manifold formed to define a cavity therein, a comb insert located in the cavity of the manifold and formed to include a plurality of channels for receiving a fluid, the comb insert including a plurality of comb walls defining the plurality of channels; and a plurality of vanes removably received in one of the plurality of channels to guide the fluid through the one of the plurality of channels, each of the plurality of vanes being formed to define a throughhole formed therein to direct the fluid at the first wall or the second wall with increased velocity so as to increase the heat transfer between the fluid and the first wall or the second wall, wherein the plurality of vanes are removably coupled with the comb insert, and wherein the plurality of vanes each includes a nozzle extending away from each throughhole in a direction in which the throughhole directs the fluid at the first wall or the second wall.

14. The cold plate assembly of claim 13, wherein the plurality of vanes extend between a first wall of the plurality of comb walls and a second wall of the plurality of comb walls neighboring the first wall, wherein the plurality of vanes includes a plurality of first vanes and a plurality of second vanes, wherein each first vane of the plurality of first vanes extends from the first wall to the second wall of the plurality of comb walls, wherein each second vane of the plurality of second vanes extends from the second wall to the first wall of the plurality of comb walls, wherein each first vane of the plurality of first vanes includes a first base end and a first terminal end opposite the first base end, wherein each second vane of the plurality of second vanes includes a second base end and a second terminal end opposite the second base end, wherein each first vane extends from the first base end contacting the first wall of the plurality of comb walls to the first terminal end contacting the second wall of the plurality of comb walls, and wherein each second vane extends from the second base end contacting the second wall to the second terminal end contacting the first wall.

15. The cold plate assembly of claim 14, wherein the first base end of each first vane is connected to the second terminal end of an adjacent second vane, and wherein the second base end of each second vane is connected to the first terminal end of an adjacent first vane so as to form a single strip of vanes.

16. The cold plate assembly of claim 14, wherein the plurality of channels extend from a first end of the comb insert to a second end of the comb insert opposite the first end, wherein each first vane and each second vane also extends from the first and second walls, respectively, toward the second end of the comb insert, and wherein a first angle and a second angle formed between the first and second walls and the first and second vanes, respectively, are in a range of 45 degrees to 85 degrees.

17. The cold plate assembly of claim 14, wherein the manifold includes a plurality of cooling passages extending through the manifold and open into the cavity, and wherein the plurality of channels of the comb insert receive the fluid from the plurality of cooling passages and transfer heat to the fluid.

18. The cold plate assembly of claim 13, wherein the comb insert includes a base panel, the plurality of comb walls protruding therefrom, and wherein the plurality of vanes are removable from the base panel and the plurality of comb walls of the comb insert.

19. A method comprising
    forming a cavity within a manifold,
    forming a plurality of cooling passages within the manifold, the plurality of cooling passages opening into the cavity,
    arranging a comb insert in the cavity of the manifold, the comb insert including a plurality of channels for receiving a fluid from the plurality of cooling passages and transferring heat to the fluid, the comb insert including a base panel and a plurality of comb walls protruding away from the base panel and extending from a first end of the base panel to a second end of the base panel opposite the first end to define the plurality of channels,
    removably coupling a plurality of vanes with the comb insert, the plurality of vanes being received in one of the plurality of channels to guide the fluid through the one of the plurality of channels, the plurality of vanes extending between a first wall of the plurality of comb walls and a second wall of the plurality of comb walls neighboring the first wall, and
    directing the fluid at the first wall or the second wall through a throughhole formed in each of the plurality of vanes with increased velocity so as to increase the heat transfer between the fluid and the first wall or the second wall,
    wherein the plurality of vanes each includes a nozzle extending away from each throughhole in a direction in which the throughhole directs the fluid at the first wall or the second wall.

\* \* \* \* \*